United States Patent
Zhang et al.

(10) Patent No.: US 11,894,231 B2
(45) Date of Patent: Feb. 6, 2024

(54) SEMICONDUCTOR FABRICATION METHOD AND STRUCTURE USING MULTIPLE SACRIFICIAL LAYERS TO FORM SIDEWALL SPACERS

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Longjuan Tang, Shanghai (CN); Chenxi Yang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 221 days.

(21) Appl. No.: 17/208,511

(22) Filed: Mar. 22, 2021

(65) Prior Publication Data
US 2021/0320007 A1    Oct. 14, 2021

(30) Foreign Application Priority Data
Apr. 8, 2020   (CN) .......................... 202010270724.3

(51) Int. Cl.
*H01L 21/033*   (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0338; H01L 21/0332; H01L 21/0335; H01L 21/0337; H01L 21/76237; H01L 21/28132; H01L 21/3086; H01L 21/0334
USPC ......................................................... 257/681
See application file for complete search history.

(56) References Cited

U.S. PATENT DOCUMENTS

| 8,932,955 B1* | 1/2015 | Sel ....................... H01L 21/3086 438/700 |
| 2014/0099792 A1* | 4/2014 | Bergendahl ......... H01L 21/3086 257/E21.249 |
| 2014/0138797 A1* | 5/2014 | Cheng ................. H01L 21/3086 257/618 |

(Continued)

*Primary Examiner* — Fazli Erdem
(74) *Attorney, Agent, or Firm* — Anova Law Group, PLLC

(57) ABSTRACT

Semiconductor structures and fabrication methods thereof are provided. The method may include providing a to-be-etched layer; forming a plurality of core layers on the to-be-etched layer, wherein a first opening and a second opening are formed between different adjacent core layers and a width of the first opening is smaller than a width of the second opening; forming a first sacrificial material layer on the to-be-etched layer and the plurality of core layers; forming a second sacrificial layer on a portion of the first sacrificial material layer in the first opening to form a sacrificial structure in the first opening; removing the plurality of core layers after forming the sacrificial structure; forming sidewall spacers on sidewall surfaces of the sacrificial structure after removing the plurality of core layers; and removing the sacrificial structure after forming the sidewall spacers.

14 Claims, 4 Drawing Sheets

(56) References Cited

U.S. PATENT DOCUMENTS

2015/0243503 A1* 8/2015 Leobandung ..... H01L 21/28132
                                                      438/427
2016/0307768 A1* 10/2016 Chen ................. H01L 21/3065
2017/0200641 A1* 7/2017 Tsai .................. H01L 21/32133
2021/0082698 A1* 3/2021 Tien ................. H01L 21/76816

* cited by examiner

SEMICONDUCTOR FABRICATION METHOD AND STRUCTURE USING MULTIPLE SACRIFICIAL LAYERS TO FORM SIDEWALL SPACERS

CROSS-REFERENCE TO RELATED APPLICATION

This application claims the priority of Chinese Patent Application No. 202010270724.3, filed on Apr. 8, 2020, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

With the continuous reduction of the minimum line widths and pitches of integrated circuit design, the optical resolution of the 193 nm deep ultraviolet immersion lithography machine used in the photolithography process has reached the limit (its minimum spatial half-period is about 38 nm), and the wavelength cannot be reduced. To continue to reduce the spatial half-period and increase the pattern density of integrated circuits, the self-aligned multiple patterning (SAMP) technology based on mandrel and spacer processes has been developed, including the self-aligned double patterning (SADP), the self-aligned triple patterning (SATP), the self-aligned quadruple patterning (SAQP), and the self-aligned sextuple patterning (SASP), etc.

However, the existing self-aligned multi-pattern technology has a complicated process for the pattern formation, especially for forming the patterns with different pitches, requiring the formation of a multilayer stacked film structure to transfer the pattern layer by layer, and the process is relatively lengthy.

Therefore, there is a need to improve the self-aligned multiple pattern technology. The disclosed methods and semiconductor structures are directed to solve one or more problems set forth above and other problems in the art.

SUMMARY

One aspect of the present disclosure provides a method for forming a semiconductor structure. The method may include providing a to-be-etched layer; and forming a plurality of core layers on the to-be-etched layer. A first opening and a second opening are formed between different adjacent layers and a width of the first opening is smaller than a width of the second opening. The method may also include forming a first sacrificial material layer on the to-be-etched layer and the plurality of core layers; forming a second sacrificial layer on a portion of the first sacrificial material layer in the first opening to form a sacrificial structure in the first opening; removing the plurality of core layers after forming the sacrificial structure; forming sidewall spacers on sidewall surfaces of the sacrificial structure after removing the plurality of core layers; and removing the sacrificial structure after forming the sidewall spacers.

Optionally, the method for forming the second sacrificial layer may include forming a second sacrificial material layer on the first sacrificial material layer to fill the first opening; etching back the second sacrificial material layer until a surface of the first sacrificial material layer is exposed to form an initial second sacrificial layer on inner sidewall surfaces of the first opening and the second opening; and removing a portion of the initial second sacrificial layer in the second opening to form the second sacrificial layer in the first opening.

Optionally, a material of the second sacrificial material layer is different from a material of the first sacrificial material layer.

Optionally, the material of the second sacrificial layer includes an inorganic material; and the inorganic material includes silicon oxide.

Optionally, after forming the second sacrificial layer and before removing the plurality of core layers, the method further includes: forming a first sacrificial layer on the inner side surfaces of the first opening. The sacrificial structure includes the first sacrificial layer and the second sacrificial layer on the first sacrificial layer.

Optionally, the method for forming the first sacrificial layer includes etching back the first sacrificial material layer after forming the second sacrificial layer until a surface of the to-be-etched layer is exposed to form the first sacrificial layer on the inner sidewall surfaces of core layers.

Optionally, a material of the first sacrificial material layer is different from a material of the plurality of sidewall spacers.

Optionally, the material of the first sacrificial material layer includes a metal-containing material; the metal-containing material includes one or more of titanium oxide and aluminum oxide; the material of the plurality of sidewall spacers includes an amorphous material; and the amorphous material includes amorphous silicon.

Optionally, the material of the plurality of sidewall spacers includes a metal-containing material; the metal-containing material includes one or more of titanium oxide and aluminum oxide; the material of the first sacrificial material layer includes an amorphous material; and the amorphous material includes amorphous silicon.

Optionally, the method for forming the first sacrificial layer includes etching back the first sacrificial material layer after forming the second sacrificial layer until the surface of the to-be-etched layer is exposed to form an initial first sacrificial layer on the inner sidewall surfaces of the core layers; and modifying the initial first sacrificial layer to form the first sacrificial layer after removing the plurality of core layers.

Optionally, modifying the initial first sacrificial layer includes an ion implantation process; and ions of the ion implantation process include carbon ions, nitrogen ions, and boron ions, or fluoride ions.

Optionally, a material of the first sacrificial layer is same as a material of the sidewall spacers.

Optionally, the material of the first sacrificial material layer includes an amorphous material; the metal amorphous material includes amorphous silicon; the material of the plurality of sidewall spacers includes an amorphous material; and the amorphous material includes amorphous silicon.

Optionally, a material of the first sacrificial layer is different from a material of the plurality of core layers; and a material of the second sacrificial layer is different from the material of the plurality of core layers.

Optionally, the material of the plurality of core layers includes an inorganic material; and the inorganic material includes silicon nitride.

Optionally, the method further includes forming a first sacrificial layer on sidewall surfaces of the second opening.

Optionally, after removing the plurality of core layers, the method further includes forming sidewall spacers on sidewall surfaces of the first sacrificial layer in the second opening; and removing the first sacrificial layer in the second opening after forming the sidewall spacers.

Another aspect of the present disclosure provides a semiconductor structure. The semiconductor structure may include a to-be-etched layer; and a plurality of sidewall spacers on the to-be-etched layer. Distances between adjacent sidewall spacers are different. The plurality of sidewall spacers are formed by forming a plurality of core layers on the to-be-etched layer, wherein a first opening and a second opening are formed between different two adjacent core layers and a width of the first opening is smaller than a width of the second opening; forming a first sacrificial material layer on the to-be-etched layer and the plurality of core layers; forming a second sacrificial layer on a portion of the first sacrificial material layer in the first opening to form a sacrificial structure in the first opening; removing the plurality of core layers after forming the sacrificial structure; and forming sidewall spacers on sidewall surfaces of the sacrificial structure.

Optionally, the to-be-etched layer includes a substrate and a transition structure on the substrate.

Optionally, a material of the transition structure is different from a material of the first sacrificial material layer; the material of the transition structure is different from a material of the plurality of sidewall spacers; and the material of the transition structure includes an inorganic material, and the inorganic material includes silicon oxide.

The present disclosure may have the following beneficial effects.

In the method for forming a semiconductor structure in the technical solution of the present disclosure, a plurality of core layers are formed on the to-be-etched layer, and a first opening and a second opening are arranged between adjacent core layers. A sacrificial structure may be formed in the first opening, and then sidewall spacers may be formed on the sidewall surfaces of the sacrificial structure. The sidewall spacers may be transferred as patterns of the semiconductor structure. Thus, there may be no need to form additional mask structures or core structures. Accordingly, the process flow may be simplified, the production cost may be reduced, and the production efficiency may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A self-aligned multiple patterning method uses preformed photolithography patterns as the core layers to form sidewall spacers on both sides of the core layers, and then etches and removes the previously formed photolithography patterns and transfers the sidewall patterns to the bottom material layer to obtain patterns with a smaller feature size. Then, the patterns formed on the bottom material layer are used as the core layers and the above steps are repeated. The pattern density obtained each time is twice the pattern density of the previous core layers. This requires the formations of multiple core material layers and multiple transition structures for transferring the sidewall spacer patterns to the bottom material layer, and the stacking of the multiple layers is more complicated.

The stacked layers are relative thick. On the one hand, as the size becomes smaller and smaller, the requirements for the accuracy of the shape and size of the patterns are become higher and higher. When the patterns are transferred layer by layer, the accuracy of the size and shape of the patterns will be affected and a certain drift occurs, and the accuracy cannot meet the requirements. On the other hand, it is necessary to form multiple stacked layers and etch the multiple stacked layers layer-by-layer, the production cost is relatively high.

The present disclosure provides a semiconductor structure and a method for forming a semiconductor structure. By forming a plurality of core layers on the to-be-etched layer, a first opening and a second opening may be formed between adjacent core layers. A sacrificial structure may be formed in the first opening, and sidewall spacers may be formed on the sidewall surfaces of the sacrificial structure. The sidewall spacers may be transferred as patterns of the semiconductor structure. Thus, other mask structures or core structures may not need to be formed, and the process flow may be simplified. Accordingly, the production cost may be reduced, and the production efficiency may be improved.

Figure 11:
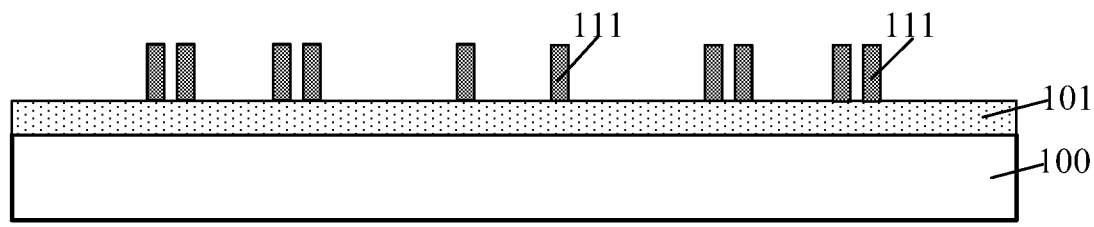
Figure 12:
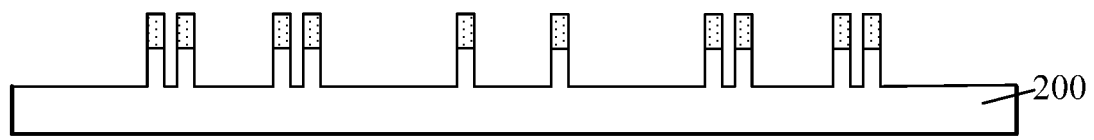
Figure 13:
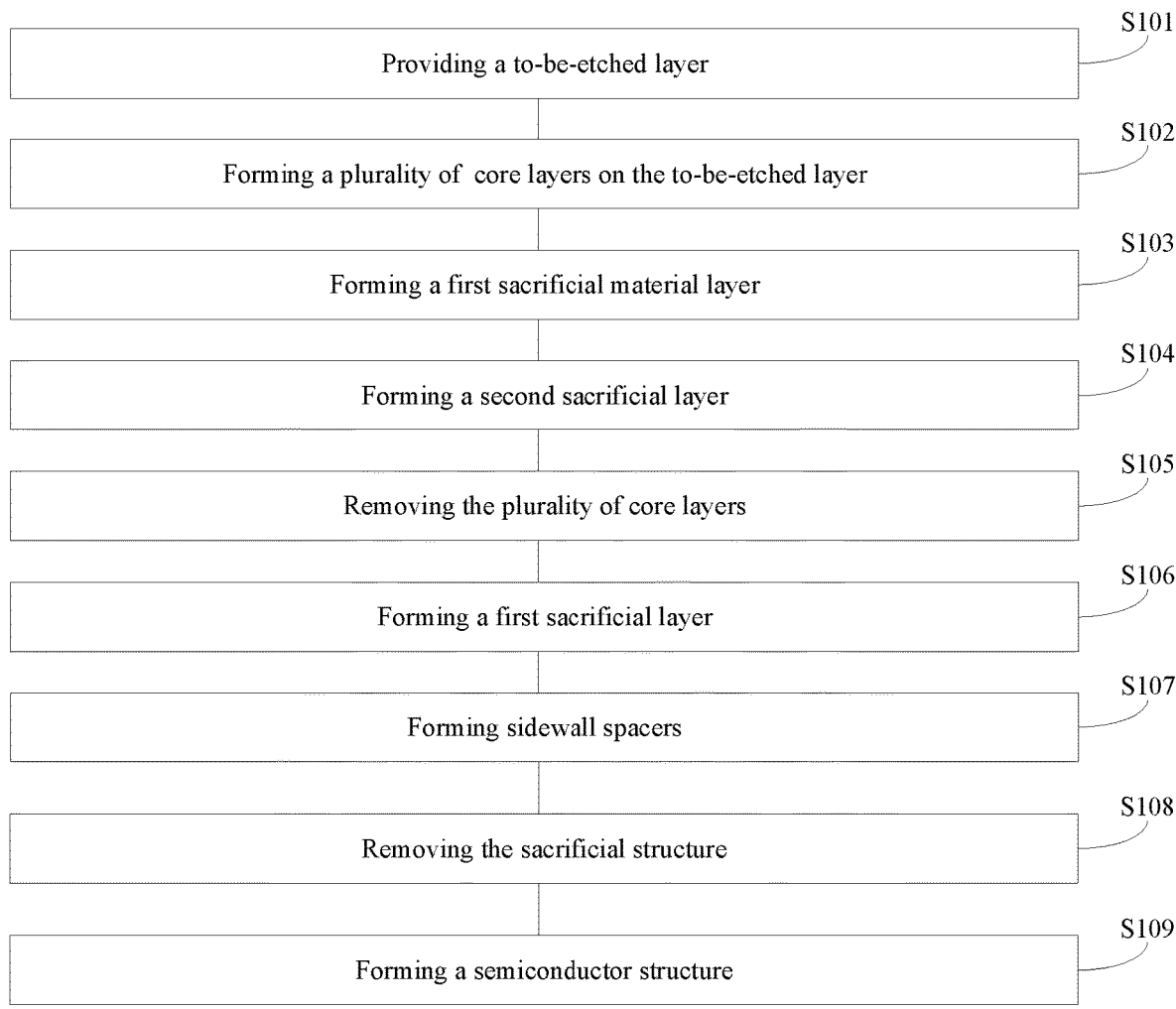
FIG. 13 illustrates an exemplary fabrication process of a semiconductor structure consistent with various disclosed embodiments of the present disclosure.

FIG. 13 illustrates an exemplary fabrication process of a semiconductor structure consistent with various disclosed embodiments of the present disclosure. FIGS. 1-12 illustrate structures corresponding to certain stages during the exemplary fabrication process of the semiconductor structure.

Figure 1:
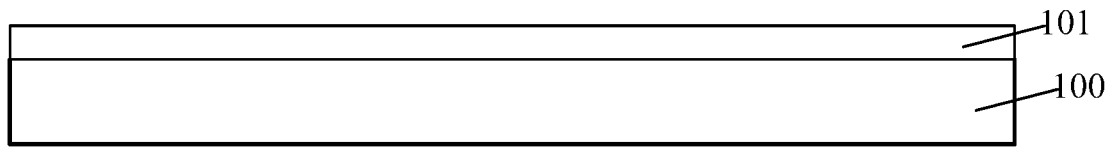
FIGS. 1-12 illustrate structures corresponding to certain stages during an exemplary fabrication process of a semiconductor structure consistent with various disclosed embodiments of the present disclosure.

As shown in FIG. 13, at the beginning of the fabrication process, a to-be-etched layer may be provided (S101). FIG. 1 illustrates a corresponding structure.

As shown in FIG. 1, a to-be-etched layer is provided. The to-be-etched layer may include a substrate 100 and a transition structure 101 on the substrate 100.

The material of the substrate 100 may include a semiconductor material or a metal material, etc. The semiconductor material may include single crystal silicon, polysilicon, germanium, silicon germanium, gallium arsenide, silicon-on-insulator, or germanium-on-insulator, etc. The metal material may include one or more of aluminum, tungsten, and titanium nitride, etc. The material of the transition structure 101 may include an inorganic material. The inorganic material may include one or more of silicon oxide, silicon nitride, silicon oxynitride, silicon carbide, silicon carbonitride, and silicon oxycarbonitride, etc.

In one embodiment, the material of the substrate 100 includes single crystal silicon, and the material of the transition structure 101 includes silicon oxide. In another embodiment, the material of the substrate includes copper; and the material of the transition structure includes silicon nitride, or a stack of silicon oxide and silicon nitride.

Figure 2:
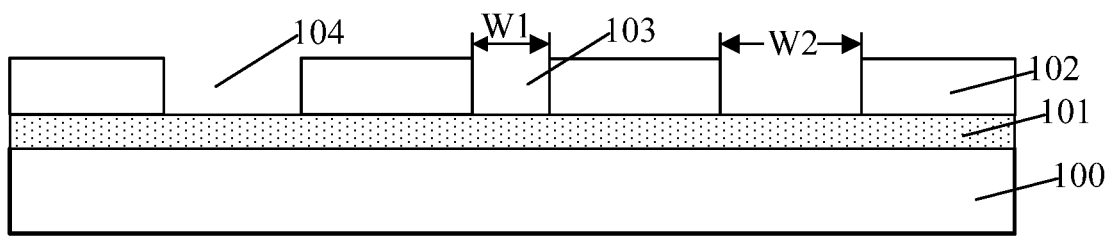

Returning to FIG. 13, after providing the to-be-etched layer, a plurality of core layers may be formed (S102). FIG. 2 illustrates a corresponding structure.

As shown FIG. 2, a plurality of core layers 102 may be formed on the to-be-etched layer. First opening 103 and second openings 104 may be formed between adjacent core layers 102. For example, one first opening 103 may be formed between two adjacent core layers 102; and one second opening 104 may be formed between another two adjacent core layers 102. Along the direction in which the plurality of core layers 102 are distributed on the surface of the to-be-etched layer, the first width W1 of the first opening 103 is smaller than the second width W2 of the second opening 104.

The method for forming the plurality of core layers 102 may include forming a core material layer (not shown) on the to-be-etched layer; forming a patterned mask layer (not shown) on the core material layer; and etching the core material layer using the patterned mask layer as an etching mask until the surface of the to-be-etched layer is exposed. Accordingly, the plurality of core layers 102 may be formed on the to-be-etched layer.

The material of the core layers 102 may be different from the material of the transition structure 101. Thus, when the core material layer is etched to form the core layers 102, the etching process may cause less damage to the to-be-etched layer.

The material of the core layers 102 may include an inorganic material, and the inorganic material may include one or more of silicon oxide, silicon nitride, silicon oxynitride, silicon carbide, silicon oxynitride, and silicon oxycarbonitride, etc. In one embodiment, the material of the core layers 102 includes silicon nitride.

Figure 3:
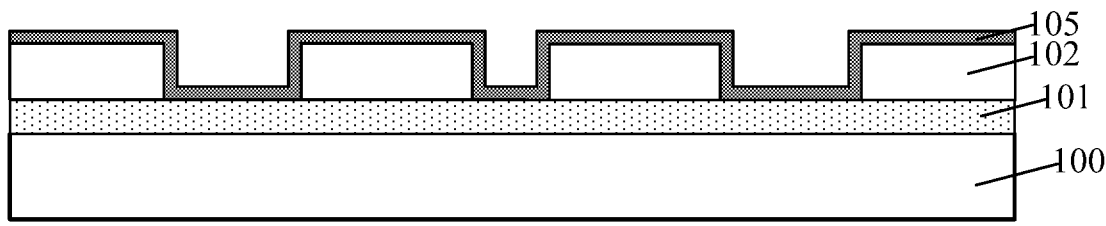

Returning to FIG. 13, after forming the plurality of core layers, a first sacrificial material layer may be formed (S103). FIG. 3 illustrates a corresponding structure.

As shown in in FIG. 3, a first sacrificial material layer 105 may be formed on the to-be-etched layer and the plurality of core layers 102. In one embodiment, the first sacrificial material layer 105 may be located on the top surfaces and the sidewall surfaces of the core layers 102. The first sacrificial material layer 105 may provide material for subsequently forming a first sacrificial layer.

The process for forming the first sacrificial material layer 105 may include an atomic layer deposition process, a chemical vapor deposition process, or a heat treatment process, etc. In one embodiment, the process for forming the first sacrificial material layer 105 may include an atomic layer deposition process. The atomic layer deposition process may be able to form the first sacrificial material layer 105 with a dense structure and a relatively small thickness.

The material of the first sacrificial material layer 105 may be different from the material of the subsequently formed second sacrificial layer such that, when a second sacrificial layer is subsequently formed on the surface of the first sacrificial material layer 105 in the first opening 103, the process for forming the second sacrificial layer may have less damage to the first sacrificial material layer 105, and the first sacrificial material layer 105 may provide a certain protective effect on the to-be-etched layer.

In one embodiment, the material of the first sacrificial material layer 105 may be same as the material of the subsequently formed sidewall spacers.

In one embodiment, the material of the first sacrificial material layer 105 may include an amorphous material. The amorphous material may include amorphous silicon, etc.

In some embodiments, the material of the first sacrificial material layer may be different from the material of the sidewall spacers.

In other embodiments, the material of the first sacrificial material layer may include a metal-containing material. The metal-containing material may include one or more of titanium oxide, and aluminum oxide, etc.

A second sacrificial layer may be formed on the surface of the first sacrificial material layer 105 in the first opening 103, and a sacrificial structure may be formed in the first opening 103.

The sacrificial structure may include a first sacrificial layer and a second sacrificial layer on the surface of the first sacrificial layer. The process for forming the sacrificial structure may be referred to FIGS. 4-6.

Figure 4:
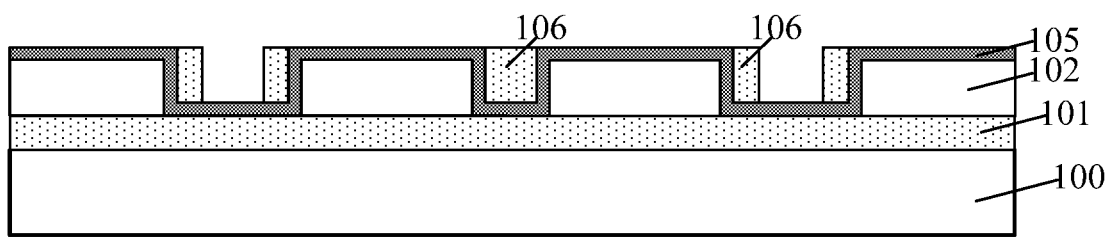
Figure 5:
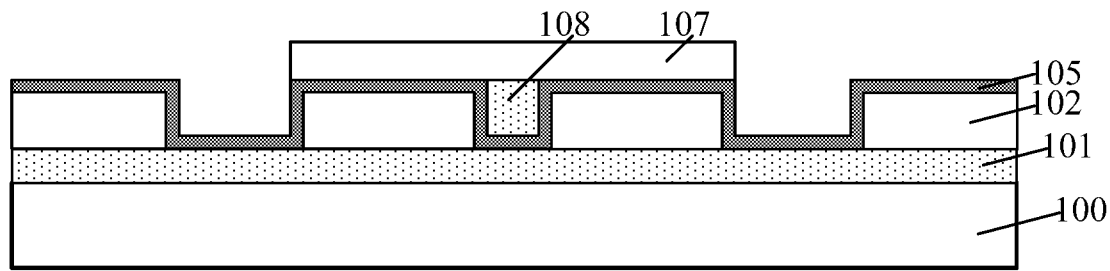

Returning to FIG. 13, after forming the first sacrificial material layer, a second sacrificial layer may be formed (S104). FIGS. 4-5 illustrate corresponding structures.

As show shown in FIGS. 4-5, a second sacrificial layer 108 may be formed on the surface of the portion of the first sacrificial material layer 105 in the first opening 103.

Referring to FIG. 4, a second sacrificial material layer (not shown) may be formed on the surface of the first sacrificial material layer 105. The second sacrificial material layer may fill the first opening 103. The second sacrificial material layer may be etched back until the surface of the first sacrificial material layer 105 is exposed, and an initial second sacrificial layer 106 may be formed in the first opening 103 and on the sidewall surfaces of the second opening 104.

The material of the second sacrificial material layer may be different from the material of the first sacrificial material layer 105. The material of the second sacrificial material layer may be different from the material of the core layers 102.

When the material of the second sacrificial material layer is different from the material of the first sacrificial material layer 105, the second sacrificial material layer and the first sacrificial material layer 105 may have a relatively large etching selectivity ratio. Thus, the process for forming the second sacrificial layer may have less damage to the first sacrificial material layer 105. The material of the second sacrificial material layer may be different from the material of the core layers 102, when the core layers 102 are subsequently removed, the process for removing the core layers 102 may cause less damage to the formed second sacrificial layer; and the morphology of the subsequently formed sidewall spacers may be as desired.

The material of the second sacrificial material layer may include an inorganic material. The inorganic material may include one or more of silicon oxide, silicon nitride, silicon oxynitride, silicon carbide, silicon oxynitride, and silicon oxycarbonitride, etc. The process for forming the second sacrificial material layer may include an atomic layer deposition process, a chemical vapor deposition process, or a heat treatment process, etc.

In one implementation, the material of the second sacrificial material layer may include silicon oxide; and the process for forming the second sacrificial material layer may include a chemical vapor deposition process.

Referring to FIG. 5, after forming the initial second sacrificial layer 106, the initial second sacrificial layer 106 on the sidewall surfaces of the second opening 104 may be removed, and the second sacrificial layer 108 may be formed in the first opening 103.

The method for forming the second sacrificial layer 108 may include forming a mask layer 107 on the surface of the initial second sacrificial layer 106 in the first opening 103. The mask layer 107 may expose the initial second layer in the second opening 104. Then, the initial second sacrificial layer 106 in the second opening 104 may be removed using the mask layer 107 as a mask to form a second sacrificial layer 108 in the first opening 103.

The process for removing the initial second sacrificial layer 106 in the second opening 104 may include one or more of a dry etching process and a wet etching process, etc.

In one embodiment, the material of the mask layer 107 may include photoresist.

After forming the second sacrificial layer 108, the mask layer 107 may be removed.

Figure 6:
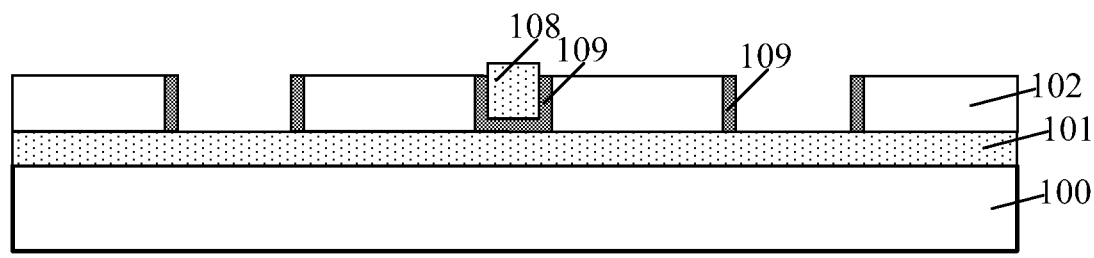

Further, referring to FIG. 6, after forming the second sacrificial layer 108, an initial first sacrificial layer 109 may be formed on the inner sidewall surfaces of the first opening 103.

The method for forming the initial first sacrificial layer 109 may include etching back the first sacrificial material layer 105 until the surface of the to-be-etched layer is exposed. Accordingly, the initial first sacrificial layer 109 may be formed on the sidewall surfaces of the core layers 102.

The material of the first sacrificial material layer 105 may be different from the material of the core layers 102, and the material of the first sacrificial material layer 105 may be different from the material of the transition structure 101. Thus, the first sacrificial material layer 105 may have a relatively large etching selectivity ratio with the core layers 102, and the first sacrificial material layer 105 and the transition structure 101 may have a relatively large etching selectivity ratio. Accordingly, the etching-back process applied to the first sacrificial material layer may cause less damage to the core layers 102 and the to-be-etched layer.

In one embodiment, when the initial first sacrificial layer 109 is formed on the inner sidewall surfaces of the first opening 103, the initial first sacrificial layer 109 may also be formed on the sidewall surfaces of the second opening 104.

In one embodiment, the material of the first sacrificial material layer 105 may be same as the material of the subsequently formed sidewall spacers. Thus, the initial first sacrificial layer 109 may need to be modified subsequently to form the first sacrificial layer, such that the first sacrificial layer and the sidewall spacers may have a large etching selectivity ratio. The sacrificial structure may include a first sacrificial layer and the second sacrificial layer 108.

In some embodiments, the material of the first sacrificial material layer is different from the material of the sidewall spacers formed subsequently. Thus, the initial first sacrificial layer may not need to be modified. The sacrificial structure may include a first initial first sacrificial layer and a second sacrificial layer.

Figure 7:
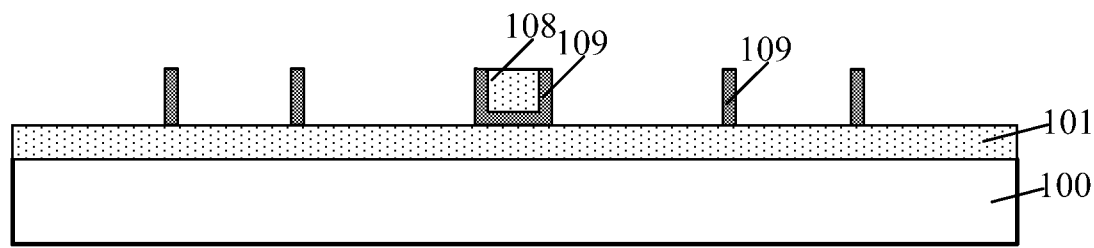

Returning to FIG. 13, after forming the initial first sacrificial layer, the core layers may be removed (S105). FIG. 7 illustrates a corresponding structure.

As shown in FIG. 7, after forming the initial first sacrificial layer 109, the core layers 102 may be removed. The process for removing the core layers 102 may include one or more of a dry etching process, and a wet etching process, etc.

The material of the core layers 102 may be different from the material of the second sacrificial layer 108, the material of the core layers 102 may be different from the material of the initial first sacrificial layer 109, and the material of the core layers 102 may be different from the material of the transition structure 101. Thus, when the core layers 102 are removed, the process for removing the core layers 102 may cause less damage to the second sacrificial layer 108, the initial first sacrificial layer 109, and the to-be-etched layer. Accordingly, when the sidewall spacer patterns are subsequently formed on the sidewall surfaces of the initial first sacrificial layer 109, the size of the patterns may be accurate, and the morphology may be as desired.

Figure 8:
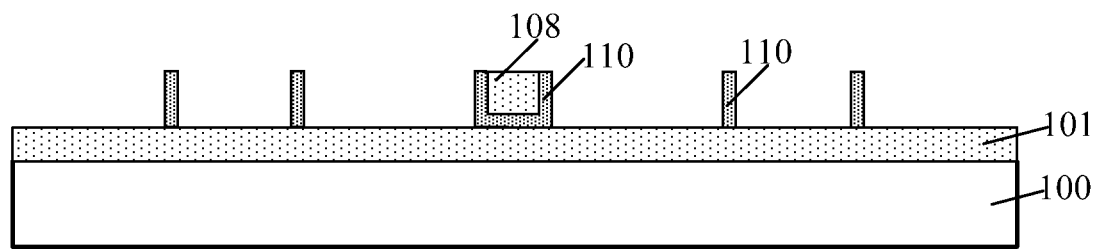

Returning to FIG. 13, after removing the core layers, the initial first sacrificial layer may be modified to form a first sacrificial layer (S106). FIG. 8 illustrates a corresponding structure.

As shown in FIG. 8, the initial first sacrificial layer 109 may be modified to form a first sacrificial layer 110.

In one embodiment, the material of the first sacrificial material layer 105 may be same as the material of the subsequently formed sidewall spacers. Thus, the initial first sacrificial layer 109 may need to be modified to form the first sacrificial layer 110 such that the first sacrificial layer 110 and the sidewall spacers may have a substantially large etching selectivity ratio.

The process for modifying the initial first sacrificial layer 109 may include an ion implantation process, or a doping process, etc. In one embodiment, the process for modifying the initial first sacrificial layer 109 may include an ion implantation process, and the implanted ions may include carbon ions, boron ions, fluoride ions, or nitrogen ions, etc.

The material of the modified first sacrificial layer 110 may be different from the material of the original first sacrificial layer 109, and thus may be different from the material of the subsequently formed sidewall spacers. Thus, the first sacrificial layer 110 and the subsequently formed sidewall spacers may have a substantially large etching selectivity ratio. Accordingly, when the first sacrificial layer 110 is subsequently removed, the sidewall spacers may be less damaged, and the sidewall spacers may have an accurate size and a desired morphology.

In some embodiments, the material of the first sacrificial material layer may be different from the material of the subsequently formed sidewall spacers. Thus, the initial first sacrificial layer may not need to be modified. The sacrificial structure may include the initial first sacrificial layer and the second sacrificial layer.

Figure 9:
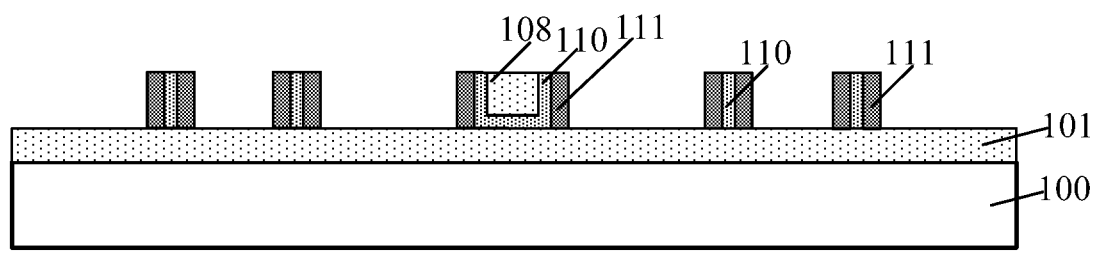

Returning to FIG. 13, after forming the first sacrificial layer, sidewall spacers may be formed (S107). FIG. 9 illustrates a corresponding structure.

Referring to FIG. 9, sidewall spacers 111 may be formed on the sidewall surfaces of the sacrificial structure and the sidewall surfaces of the first sacrificial layer 110 in the second opening 104.

The method for forming the sidewall spacers 111 may include forming a sidewall material layer (not shown) on the surface of the to-be-etched layer, the top surface and the sidewall surfaces of the first sacrificial layer 110, and the top surface and the sidewall surfaces of the sacrificial structure; and etching back the sidewall material layer until the surface of the to-be-etched layer and the top surface of the first sacrificial layer 110 are exposed.

The material of the sidewall spacers 111 may be different from the material of the first sacrificial layer 110, the material of the sidewall spacers 111 may be different from the material of the second sacrificial layer 108, and the material of the sidewall spacers 111 may be different from that of the transition structure 101. Thus, when the sidewall spacers 111 are formed, the etch-back process may cause less damage to the first sacrificial layer 110, the second sacrificial layer 108, and the to-be-etched layer, and the sidewall spacers 111 may have a desired morphology.

In one embodiment, the material of the sidewall spacers 111 may include an amorphous material, and the amorphous material may include amorphous silicon, etc.

In one embodiment, the material of the sidewall spacers 111 may be same as the material of the first sacrificial material layer 105.

In some embodiments, the material of the sidewall spacers may be different from the material of the first sacrificial material layer.

In some embodiments, the material of the sidewall spacers may include a metal-containing material, and the metal-containing material may include one or more of titanium oxide and aluminum oxide, etc.

Figure 10:
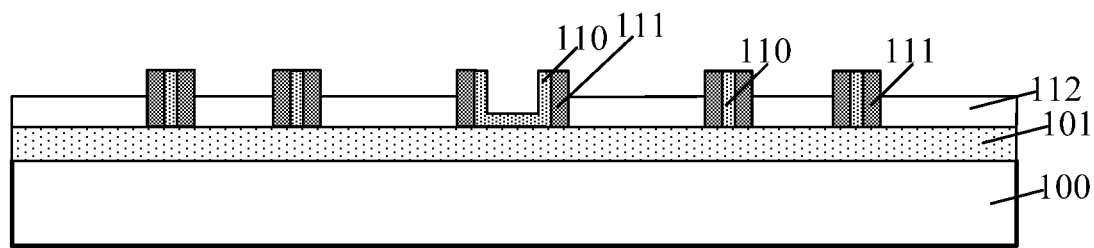

Returning to FIG. 13, after forming the sidewall spacers, the sacrificial structure may be removed (S108). FIGS. 10-11 illustrate corresponding structures.

As shown in FIG. 10, the second sacrificial layer 108 in the first opening 103 may be removed.

The method for removing the second sacrificial layer 108 in the first opening 103 may include forming a protective layer 112 on the to-be-etched layer and the sidewall surfaces of the sidewall spacers 111, and the protective layer 112 may expose the surface of the second sacrificial layer 108. Then, the second sacrificial layer 108 may be removed using the protective layer 112 as a mask.

The protective layer 112 may protect the surface of the transition structure 101 such that the process for removing the second sacrificial layer 108 may have less damage to the to-be-etched layer.

The material of the second sacrificial layer 108 may be different from the material of the first sacrificial layer 110, and the material of the second sacrificial layer 108 may be different from the material of the sidewall spacers 111. Thus, the process for removing the second sacrificial layer 108 may cause less damage to the first sacrificial layer 110 and the sidewall spacers 111.

The process for removing the second sacrificial layer 108 may include one or more of a dry etching process and a wet etching process, etc.

The material of the protective layer 112 may include an organic material, and the organic material may include amorphous carbon, or photoresist, etc.

Further, as shown in in FIG. 11, after removing the second sacrificial layer, the first sacrificial layer 110 in the first opening 103 and the second opening 104 may be removed.

The process for removing the first sacrificial layer 110 may include one or more of a dry etching process and a wet etching process, etc.

The material of the first sacrificial layer 110 may be different from the material of the sidewall spacers 111. When the first sacrificial layer 110 is removed, the process for removing the first sacrificial layer 110 may cause less damage to the sidewall spacers 111. Thus, the formed sidewall spacers 111 may have a high pattern size accuracy and a desired morphology.

Different processes may be used to remove the second sacrificial layer 108 first, and then remove the first sacrificial layer 110 such that the sacrificial structure in the first opening 103 may be removed cleanly. Accordingly, when the patterns of the sidewall spacers 111 are subsequently transferred, the shape of the semiconductor structure may be as desired.

After removing the first sacrificial layer 110, the protective layer 112 may be removed.

Returning to FIG. 13, after removing the sacrificial structure, a semiconductor structure may be formed (S109). FIG. 12 illustrates a corresponding structure.

As shown in FIG. 12, a semiconductor structure 200 may be formed by etching the to-be etched layer using the sidewall spacers 111 as a mask.

The process for etching the to-be-etched layer may include a dry etching process, etc. The dry etching process may form a semiconductor structure 200 with a desired sidewall topography.

In the method for forming the semiconductor structure 200, the plurality of core layers 102 may be formed on the to-be-etched layer, and there may be first openings 103 and second openings 104 between adjacent core layers 102. Then, the sacrificial structure may be in the first openings 103, and sidewall spacers 111 may be formed on the sidewall surfaces of the sacrificial structure. The sidewall spacers 111 may be transferred as the patterns of the semiconductor structure. Thus, there may be no need to form additional mask structures or core structures. Accordingly, the process flow may be simplified, the production costs may be reduced, and the production efficiency may be improved.

The present disclosure also provides a semiconductor structure. FIG. 11 illustrates an exemplary semiconductor structure consistent with various disclosed embodiments of the present disclosure.

As shown in FIG. 11, the semiconductor structure includes a to-be etched layer including a substrate 100 and a transition structure 101 on the substrate 100. The semiconductor structure may also include a plurality of sidewall spacers 111 on the transition structure 101. The distances between adjacent sidewall spacers 111 may be different. The detailed structures and intermediate structures are described above with respect to the fabrication processes.

Thus, in the present method for forming a semiconductor structure in the technical solution of the present disclosure, a plurality of core layers are formed on the to-be-etched layer, and a first opening and a second opening are arranged between adjacent core layers. A sacrificial structure may be formed in the first opening, and then sidewall spacers may be formed on the sidewall surfaces of the sacrificial structure. The sidewall spacers may be transferred as patterns of the semiconductor structure. Thus, there may be no need to form additional mask structures or core structures. Accordingly, the process flow may be simplified, the production cost may be reduced, and the production efficiency may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:
    providing a to-be-etched layer;
    forming a plurality of core layers on the to-be-etched layer, wherein a first opening and a second opening are formed between different adjacent core layers, and a width of the first opening is smaller than a width of the second opening;
    forming a first sacrificial material layer on the to-be-etched layer and the plurality of core layers, the first sacrificial material layer being formed on a top surface and sidewall surfaces of the first opening and the second opening and on top surfaces of the plurality of core layers;

forming an initial second sacrificial layer on a top surface and sidewall surfaces of the first sacrificial material layer in the first opening to fully fill the first opening and on sidewall surfaces of the first sacrificial material layer in the second opening, the initial second sacrificial layer being formed after the first sacrificial material layer is formed without removing a portion of the first sacrificial material layer;

after the initial second sacrificial layer is formed, removing a portion of the initial second sacrificial layer on the sidewall surfaces of the first sacrificial material layer in the second opening to form a second sacrificial layer on the top surface and the sidewall surfaces of the first sacrificial material layer in the first opening only and fully filing the first opening;

after forming the second sacrificial layer, removing a portion of the first sacrificial material layer on the top surfaces of the plurality of core layers to form an initial first sacrificial layer;

removing the plurality of core layers after forming the initial first sacrificial layer and the second sacrificial layer;

modifying the initial first sacrificial layer to form a first sacrificial layer;

forming sidewall spacers on sidewall surfaces of the first sacrificial layer after removing the plurality of core layers;

after forming the sidewall spacers, removing the second sacrificial layer;

after removing the second sacrificial layer, removing the first sacrificial layer, a material of the second sacrificial layer being different from a material of the first sacrificial layer; and after removing the first sacrificial layer, forming a semiconductor structure by etching the to-be etched layer using the sidewall spacers as a mask.

2. The method according to claim 1, wherein forming the initial second sacrificial layer comprises:

forming the initial second sacrificial layer on the first sacrificial material layer, the initial second sacrificial layer being formed on the top surface and the sidewall surfaces of the first sacrificial material layer in the first opening to fully fill the first opening, on a top surface and the sidewall surfaces of the first sacrificial material layer in the second opening, and on the first sacrificial material layer on the top surfaces of the plurality of core layers; and etching back the initial second sacrificial layer until a surface of the first sacrificial material layer is exposed.

3. The method according to claim 1, wherein:
the material of the second sacrificial layer includes an inorganic material; and
the inorganic material includes silicon oxide.

4. The method according to claim 1, wherein forming the initial first sacrificial layer comprises:

etching back the first sacrificial material layer after forming the second sacrificial layer until a surface of the to-be-etched layer is exposed to form the initial first sacrificial layer on inner sidewall surfaces of the plurality of core layers.

5. The method according to claim 4, wherein:
the material of the first sacrificial layer is different from a material of the sidewall spacers.

6. The method according to claim 5, wherein:
the material of the first sacrificial layer includes a metal-containing material;
the metal-containing material includes one or more of titanium oxide and aluminum oxide; the material of the sidewall spacers includes an amorphous material; and
the amorphous material includes amorphous silicon.

7. The method according to claim 5, wherein:
the material of the sidewall spacers includes a metal-containing material;
the metal-containing material includes one or more of titanium oxide and aluminum oxide;
the material of the first sacrificial layer includes an amorphous material; and
the amorphous material includes amorphous silicon.

8. The method according to claim 1, wherein:
modifying the initial first sacrificial layer includes an ion implantation process; and
ions of the ion implantation process include carbon ions, nitrogen ions, boron ions, or fluoride ions.

9. The method according to claim 8, wherein:
the material of the first sacrificial layer is same as a material of the sidewall spacers.

10. The method according to claim 9, wherein:
the material of the first sacrificial layer includes an amorphous material;
the amorphous material includes amorphous silicon;
the material of the sidewall spacers includes an amorphous material; and
the amorphous material includes amorphous silicon.

11. The method according to claim 5, wherein:
the material of the first sacrificial layer is different from a material of the plurality of core layers; and
the material of the second sacrificial layer is different from the material of the plurality of core layers.

12. The method according to claim 11, wherein:
the material of the plurality of core layers includes an inorganic material; and
the inorganic material includes silicon nitride.

13. The method according to claim 1, wherein:
the to-be-etched layer includes a substrate and a transition structure on the substrate.

14. The method according to claim 13, wherein:
a material of the transition structure is different from the material of the first sacrificial layer;
the material of the transition structure is different from a material of the sidewall spacers; and
the material of the transition structure includes an inorganic material, and the inorganic material includes silicon oxide.

* * * * *